(12) United States Patent
Lane et al.

(10) Patent No.: US 9,484,281 B2
(45) Date of Patent: Nov. 1, 2016

(54) SYSTEMS AND METHODS FOR THERMAL DISSIPATION

(71) Applicant: QUALCOMM Incorporated, San Diego, CA (US)

(72) Inventors: Ryan David Lane, San Diego, CA (US); Charles David Paynter, Encinitas, CA (US)

(73) Assignee: QUALCOMM Incorporated, San Diego, CA (US)

(*) Notice: Subject to any disclaimer, the term of this patent is extended or adjusted under 35 U.S.C. 154(b) by 77 days.

(21) Appl. No.: 14/459,319

(22) Filed: Aug. 14, 2014

(65) Prior Publication Data

US 2016/0049349 A1 Feb. 18, 2016

(51) Int. Cl.
*H01L 23/02* (2006.01)
*H01L 23/367* (2006.01)
*H01L 23/00* (2006.01)
*H01L 25/03* (2006.01)
*H01L 25/10* (2006.01)
*H01L 25/18* (2006.01)
*H01L 25/065* (2006.01)
*H01L 23/373* (2006.01)
*H01L 23/42* (2006.01)
*H01L 23/433* (2006.01)

(52) U.S. Cl.
CPC ......... *H01L 23/367* (2013.01); *H01L 23/3677* (2013.01); *H01L 24/19* (2013.01); *H01L 25/03* (2013.01); *H01L 25/105* (2013.01); *H01L 23/3736* (2013.01); *H01L 23/3737* (2013.01); *H01L 23/42* (2013.01); *H01L 23/4334* (2013.01); *H01L 24/32* (2013.01); *H01L 24/48* (2013.01); *H01L 24/73* (2013.01); *H01L 25/0657* (2013.01); *H01L 25/18* (2013.01); *H01L 2224/12105* (2013.01); *H01L 2224/32145* (2013.01); *H01L 2224/32245* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06565* (2013.01); *H01L 2225/1035* (2013.01); *H01L 2225/1058* (2013.01); *H01L 2225/1076* (2013.01); *H01L 2225/1094* (2013.01); *H01L 2924/1431* (2013.01); *H01L 2924/1433* (2013.01); *H01L 2924/1434* (2013.01); *H01L 2924/15311* (2013.01); *H01L 2924/181* (2013.01)

(58) Field of Classification Search
CPC .................. H01L 25/0657; H01L 2924/15311
USPC .................................. 257/686, 777; 438/107
See application file for complete search history.

(56) References Cited

U.S. PATENT DOCUMENTS

| | | | |
|---|---|---|---|
| 6,716,676 B2 | 4/2004 | Chen et al. | |
| 6,833,993 B2 | 12/2004 | Wang | |
| 7,538,422 B2* | 5/2009 | Dangelo | H01L 23/373 257/706 |
| 8,039,953 B2* | 10/2011 | Dangelo | B82Y 10/00 257/706 |
| 8,299,608 B2 | 10/2012 | Bartley et al. | |

(Continued)

*Primary Examiner* — Jami M Valentine
(74) *Attorney, Agent, or Firm* — Muncy, Geissler, Olds & Lowe, P.C.

(57) ABSTRACT

A package on package semiconductor structure includes a first package positioned above a first surface of a substrate, a second package positioned above the first package, and a first thermal element positioned between the first package and the second package, wherein the first thermal element is separated from the second package by an air gap and the thermal element provides a heat path for heat generated by the first package.

20 Claims, 11 Drawing Sheets

(56) References Cited

U.S. PATENT DOCUMENTS

| | | |
|---|---|---|
| 8,304,293 B2 | 11/2012 | Railkar et al. |
| 2006/0097402 A1 | 5/2006 | Pu et al. |
| 2008/0157250 A1* | 7/2008 | Yang ................. H01L 27/14618 257/433 |
| 2012/0211885 A1* | 8/2012 | Choi ................... H01L 23/3128 257/737 |
| 2014/0084487 A1* | 3/2014 | Zhao ..................... H01L 25/105 257/777 |
| 2016/0013155 A1* | 1/2016 | Chung ............... H01L 25/0657 257/659 |

* cited by examiner

US 9,484,281 B2

SYSTEMS AND METHODS FOR THERMAL DISSIPATION

FIELD OF DISCLOSURE

This disclosure relates generally to thermal dissipation, and more specifically, but not exclusively, to thermal dissipation in semiconductor packages.

BACKGROUND

Thermal problems are continually getting harder to solve in the mobile device market as performance & use cases go up from a power distribution perspective. This can be attributable to the small form factor used in mobile computing devices and increased battery sizes resulting in larger battery area/volume. The printed circuit boards (PCBs) and resulting chipsets are driven to smaller XYZ form factors as possible to and still achieve desirable end user devices. Package on Package (PoP) techniques were adopted many years ago to reduce the XY area of the chip sets and make room for larger batteries and other features. Initially, the resulting performance did not create major thermal issues for the devices. However, the PCB area used for chipsets continues to decrease along with power increases that result in more thermal challenges.

Accordingly, there are long-felt industry needs to maintain PoP-like area efficiencies while improving thermal dissipation in mobile devices including the improved methods and apparatus provided hereby.

The inventive features that are characteristic of the teachings, together with further objects and advantages, are better understood from the detailed description and the accompanying figures. Each of the figures is provided for the purpose of illustration and description only, and does not limit the present teachings.

SUMMARY

The following presents a simplified summary relating to one or more aspects and/or embodiments associated with the apparatus and methods disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the apparatus and methods disclosed herein in a simplified form to precede the detailed description presented below.

Some exemplary embodiments of the disclosure are directed to systems, apparatus, and methods for providing a PoP efficient XY area while also providing better thermal dissipation than conventional PoP packages.

In some embodiments of the disclosure, the system, apparatus, and method includes providing access to top of base package, integrating a package heat spreader between the top and the bottom package with cutouts for PoP ball connections, providing a thermal path access to back of the die to a system thermal spreader.

In some embodiments of the disclosure, the system, apparatus, and method includes a package on package semiconductor structure comprising: a first package; a second package positioned above the first package; and a first thermal element positioned between the first package and the second package, wherein the first thermal element is separated from the second package by an air gap.

In some embodiments of the disclosure, the system, apparatus, and method may include a package on package semiconductor structure comprising: a first package; a second package positioned above the first package; and a first thermal means for dissipating heat from the first package, wherein the first thermal means is positioned between the first package and the second package and is separate from the second package by an air gap.

Other objects and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of embodiments of the disclosure and are provided solely for illustration of the embodiments and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
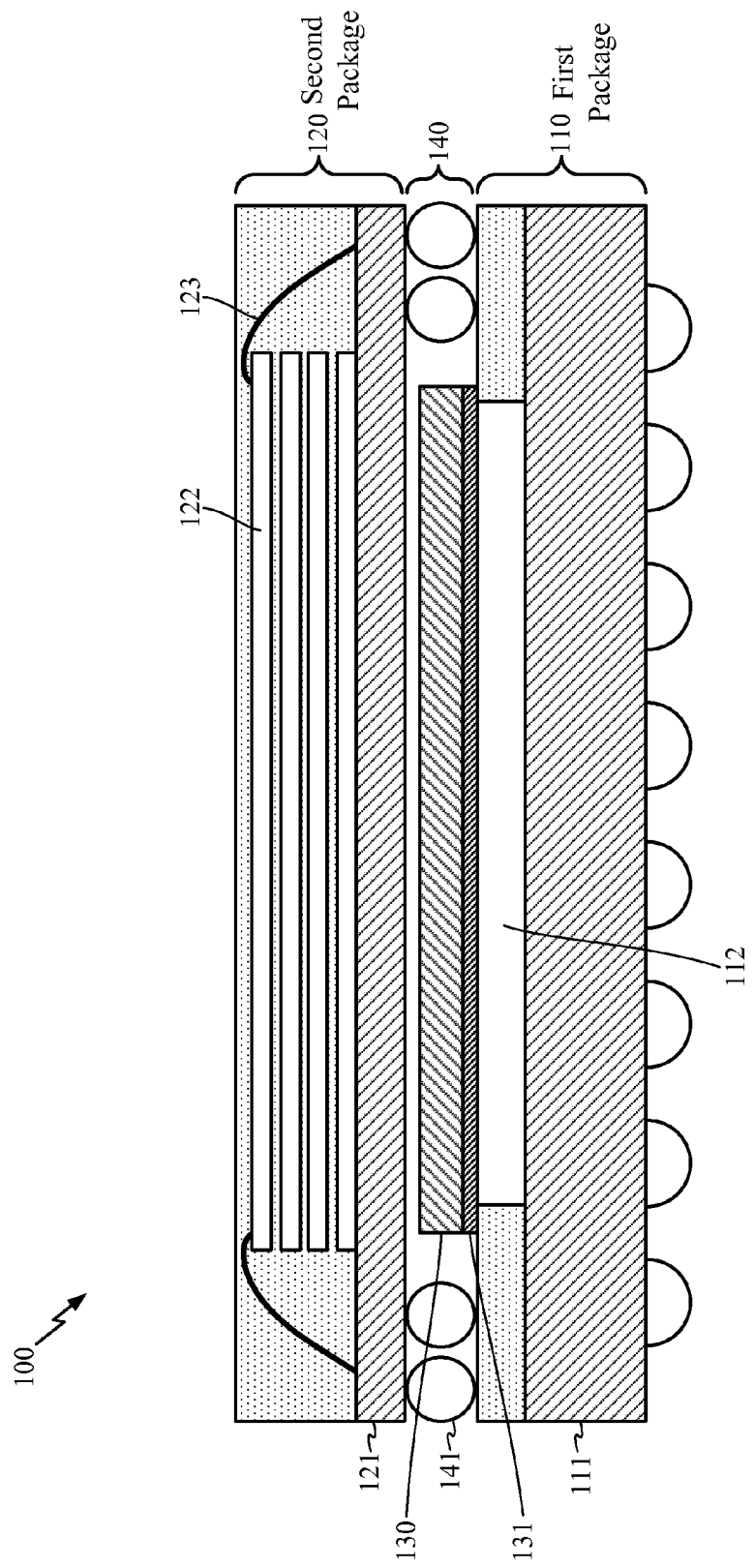
FIG. 1 depicts an exemplary side view of a semiconductor PoP structure with a thermal element.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus and systems for are provided. The exemplary methods, apparatus, and systems disclosed herein advantageously address the long-felt industry needs, as well as other previously unidentified needs, and mitigate shortcomings of the conventional methods, apparatus, and systems. For example, an advantage provided by the disclosed methods, apparatus, and systems herein is an improvement in thermal dissipation for semiconductor PoP structures.

Various aspects are disclosed in the following description and related drawings to show specific examples relating to exemplary embodiments of the disclosure. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular embodiments only and is not intended to be limiting of embodiments of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" may include any signal such as a data signal, audio signal, video signal, multimedia signal, analog signal, power signal, ground signals or connections, and digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

FIG. 1 depicts an exemplary semiconductor PoP structure with a thermal element or means. As shown in FIG. 1, a semiconductor PoP structure 100 may include a first package 110, a second package 120 positioned above the first package 110, and a thermal element or means 130 positioned above the first package 110 between the first and second packages 110 and 120. The first package 110 may include a first package substrate 111 and a first package die 112 positioned on a first surface of the first package substrate 111 such that a front side of the die 112 faces the first surface of the substrate 111 and a backside of the die 112 faces the thermal element or means 130. The die 112 may be any type of semiconductor die that generates heat such as a logic die or processor. FIG. 1 only shows one die but it should be understood that more than one die may be attached to the first package substrate.

The second package 120 may include a second package substrate 121 and a second package die 122 positioned on a first surface of the second package substrate 121 such that the second package substrate 121 is between the second package die 122 and the thermal element or means 130. As shown, the second package 120 includes a plurality of die 122 but it should be understood that one or more die may be included such as a memory or other logic die. The die 122 is shown with wire bonding 123 connecting the top die 122 with the substrate 121, but it should be understood that the wire bonding 123 may not be necessary.

The PoP structure 100 may include an air gap 140 between the first package 110 and the second package 120. The air gap 140 may provide a thermal path for heat to flow from die 112 to the perimeter of structure 100. The air gap 140 may include spacers such as solder balls 141 that maintain the separation between first package 110 and second package 120. The thermal element or means 130 may be positioned in the air gap 140 between the packages 110 and 120. The thermal element or means 130 may be composed on copper or aluminum or similar material that stores or conducts heat and allows the thermal element or means 130 to dissipate heat from the first package 110. The thermal element or means 130 may be one element such as a heat spreader or a heat sink or a combination of the two. The thermal element or means 130 may be attached to the die 112 with a thermal interface material layer 131 but it should be understood that the thermal element or means 130 may be directly connected to die 112. The thermal interface material reduces the contact resistance between the heat-generating die 112 and the thermal element or means 130 by filling voids and features created by the non-smooth surface of the mating surfaces. The thermal interface material may be an adhesive, grease, gel, phase change material, or pad. For example, a thermal interface material may consists of a polymer matrix, such as an epoxy or silicone resin, and thermally conductive fillers such as boron nitride, alumina, aluminum, zinc oxide, and silver. The thermal element or means may have a certain thickness that allows the height of the structure 100 to be as required. For example, the thermal element or means may be 100 to 200 microns thick.

Figure 2:
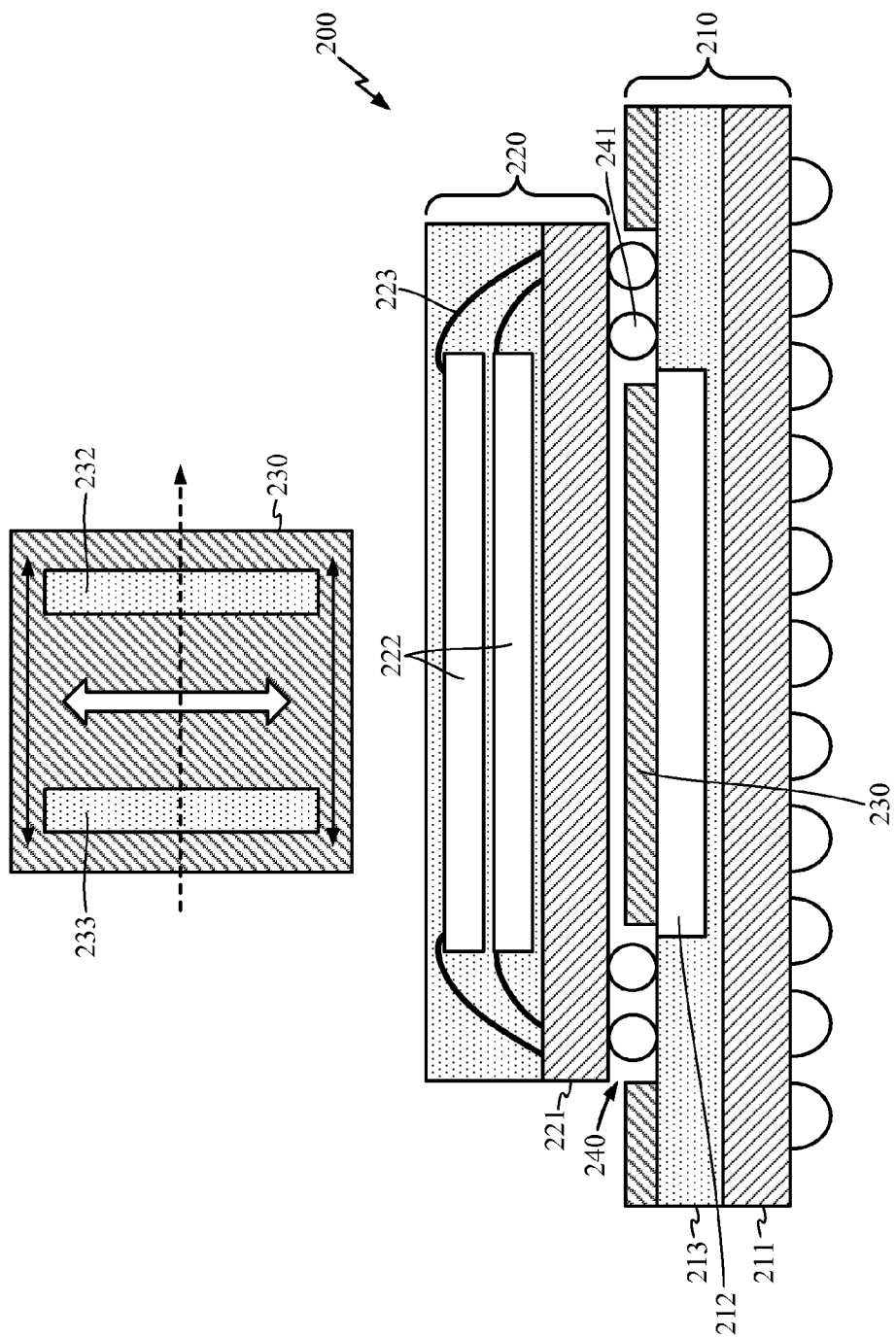
FIG. 2 depicts an exemplary top view and side view of a semiconductor PoP structure with a thermal element.

FIG. 2 depicts an exemplary semiconductor PoP structure with a thermal element or means. As shown in FIG. 2, a semiconductor PoP structure 200 may include a first package 210, a second package 220 positioned above the first package 210, and a thermal element or means 230 positioned above the first package 210 between the first and second packages 210 and 220. The first package 210 may include a first package substrate 211 and a first package die 212 positioned on a first surface of the first package substrate 211 such that a front side of the die 212 faces the first surface of the substrate 211 and a backside of the die 212 faces the thermal element or means 230. The package 210 may include a molding material 213 encapsulating the die 212. The package 210 may extend beyond the edge or perimeter of package 220 with package 220 being centered within the perimeter of package 210.

The second package 220 may include a second package substrate 221 and two second package die 222 positioned above a first surface of the second package substrate 221 such that the second package substrate 221 is between the second package die 222 and the thermal element or means 230. As shown, the second package 220 includes a plurality of die 222 but it should be understood that one or more die may be included such as a memory or other logic die. The die 222 are shown with wire bonding 223 connecting the die 222 with the substrate 221, but it should be understood that the wire bonding 223 may not be necessary.

The PoP structure 200 may include an air gap 240 between the first package 210 and the second package 220. The air gap 240 may provide a thermal path for heat to flow from die 212 to the perimeter of structure 200. The air gap 240 may include spacers such as solder balls 241 that maintain the separation between package 210 and package 220. The thermal element or means 230 may be positioned in the air gap 240 between the packages 210 and 220. The thermal element or means 230 may be composed on copper, aluminum, ceramic or similar material that stores or conducts heat. The thermal element or means 230 may be one element such as a heat spreader or a heat sink or a combination of the two. The thermal element or means may be one piece or composed of many pieces composed of the same or different materials. The thermal element or means 230 may include a first cutout area 232 and a second cutout area 233. The cutout areas 232 and 233 may correspond to the location of the solder balls 241 and be configured to encompass enough area to accommodate all the solder balls or spacers 241. As shown, the cutout areas 232 and 233 are rectangular areas of the same size located on either side of the die 212 such that the die 212 is completely within a central portion of the element 230 and element 230 is one continuous structure to allow heat spreading to all portions of the element 230.

Figure 3:
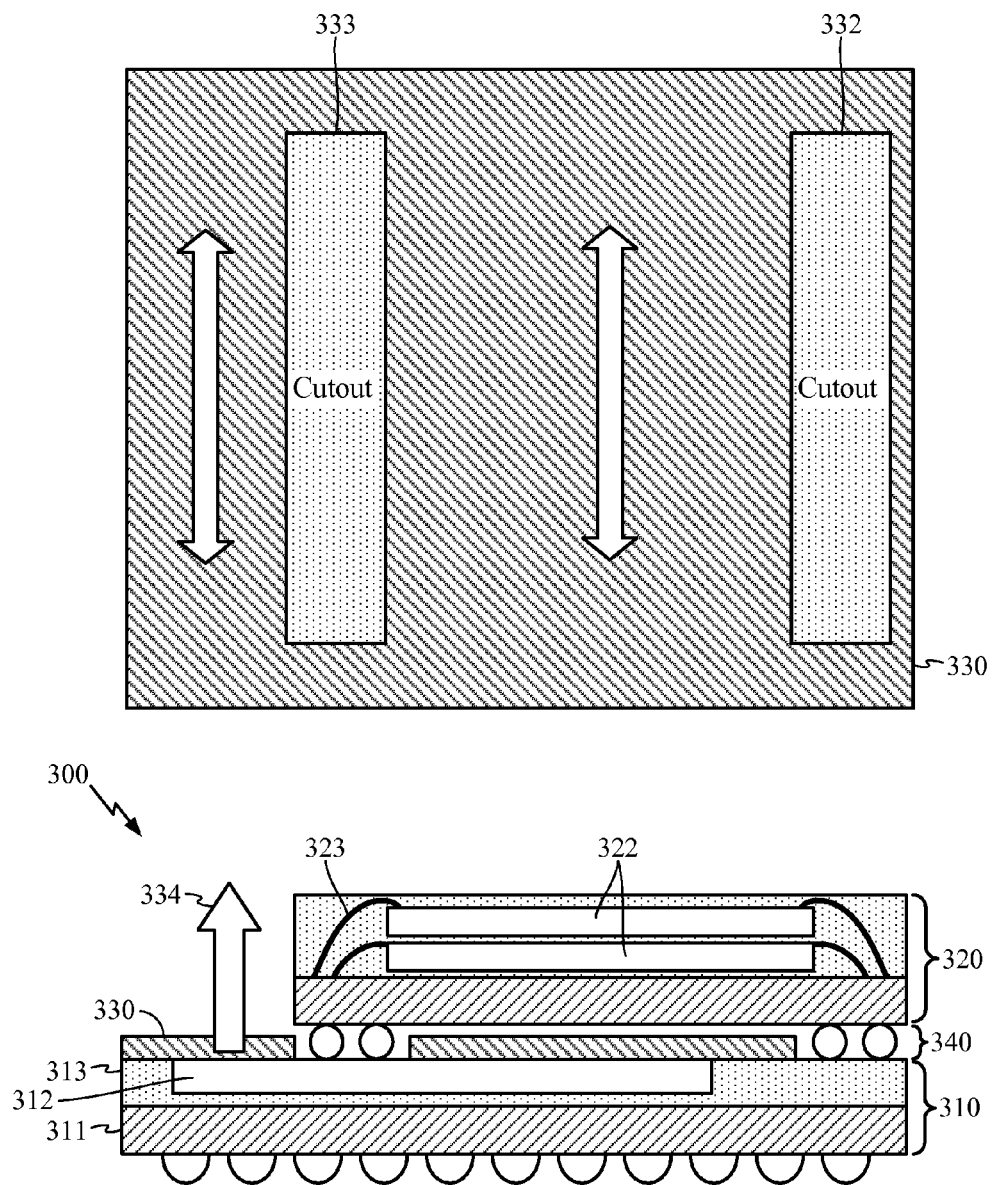
FIG. 3 depicts an exemplary top view and side view of a semiconductor PoP structure with a thermal element.

FIG. 3 depicts an exemplary semiconductor PoP structure with a thermal element or means. As shown in FIG. 3, a semiconductor PoP structure 300 may include a first package 310, a second package 320 positioned above the first package 310, and a thermal element or means 330 positioned above the first package 310 between the first and second packages 310 and 320. The first package 310 may include a first package substrate 311 and a first package die 312 positioned on a first surface of the first package substrate 311 such that a front side of the die 312 faces the first surface of the substrate 311 and a backside of the die 312 faces the thermal element or means 330. The package 310 may include a molding material 313 encapsulating the die 312. The package 310 may be large in width than package 320 with package 320 being offset from the center of package 310 but within the perimeter of package 310.

The second package 320 may include a second package substrate 321 and two second package die 322 positioned above a first surface of the second package substrate 321 such that the second package substrate 321 is between the second package die 322 and the thermal element or means 330. As shown, the second package 320 includes a plurality of die 322 but it should be understood that one or more die may be included such as a memory or other logic die. The die 322 are shown with wire bonding 323 connecting the die 322 with the substrate 321, but it should be understood that the wire bonding 323 may not be necessary.

The PoP structure 300 may include an air gap 340 between the first package 310 and the second package 320. The air gap 340 may provide a thermal path for heat to flow from die 312 to the perimeter of structure 300. The air gap 340 may include spacers such as solder balls 341 that maintain the separation between package 310 and package 320. The thermal element or means 330 may include a portion positioned in the air gap 340 between the packages 310 and 320. The thermal element or means 330 may be composed on copper, aluminum, ceramic or similar material that stores or conducts heat. The thermal element or means 330 may be one element such as a heat spreader or a heat sink or a combination of the two. The thermal element or means 330 may include a first cutout area 332 and a second cutout area 333. The cutout areas 332 and 333 may correspond to the location of the solder balls 341 and be configured to encompass enough area to accommodate all the solder balls or spacers 341. As shown, the cutout areas 332 and 333 are rectangular areas of the same size located on the perimeter of the second package 320. A portion of element 330 may extend outside the perimeter of the second package 320. This may allow an upward thermal path 334 to another heat sink or spreader (not shown). By offsetting the die 312 from die 322 and locating a portion of the thermal element or means 330 directly over a selected portion of the die 312, the selected portion of the die 312 may be thermally regulated more than other portions of die 312. This may enable configurations of thermal element or means 330 that locate a portion of the thermal element or means 330 outside the perimeter of package 320 and position that portion of the thermal element or means 330 over a part of the die 312 that generates more heat than the rest of the die 312. For example, a processor may contain a CPU or GPU that generates more heat than other portions of the processor. By positioning an offset portion of the thermal element or means over the hotter areas of the processor, the thermal dissipation may be improved overall.

Figure 4:
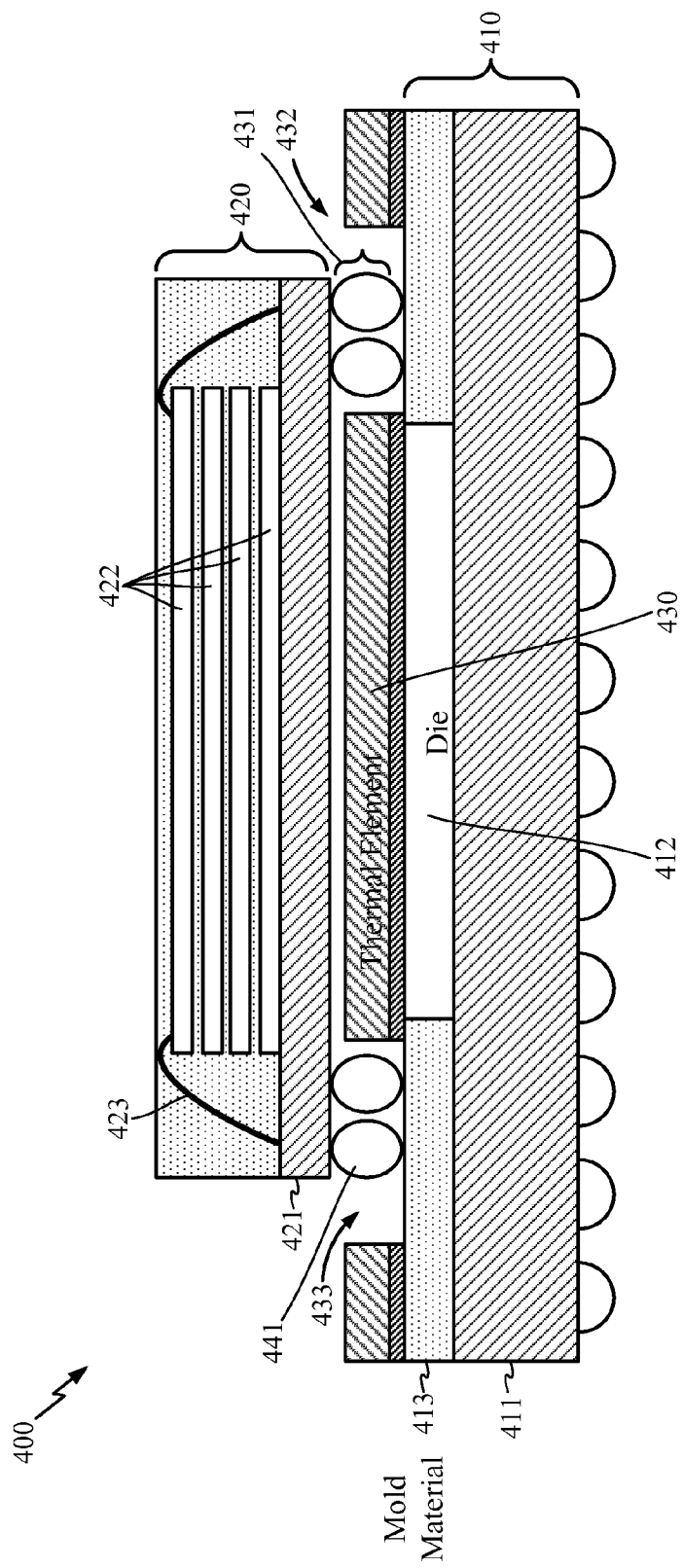
FIG. 4 depicts an exemplary side view of a semiconductor PoP structure with a thermal element.

FIG. 4 depicts an exemplary semiconductor PoP structure with a thermal element or means. As shown in FIG. 4, a semiconductor PoP structure 400 may include a first package 410, a second package 420 positioned above the first package 410, and a thermal element or means 430 positioned above the first package 410 between the first and second packages 410 and 420. The first package 410 may include a first package substrate 411 and a first package die 412 positioned on a first surface of the first package substrate 411 such that a front side of the die 412 faces the first surface of the substrate 411 and a backside of the die 412 faces the thermal element or means 430. The package 410 may include a molding material 413 encapsulating the die 412. The package 410 may be larger in width than package 420 with package 420 being centered within the perimeter of package 410.

The second package 420 may include a second package substrate 421 and four second package die 422 positioned above a first surface of the second package substrate 421 such that the second package substrate 421 is between the second package die 422 and the thermal element or means 430. As shown, the second package 420 includes a plurality of die 422 but it should be understood that one or more die may be included such as a memory or other logic die. The die 422 are shown with wire bonding 423 connecting the top die 422 with the substrate 421, but it should be understood that the wire bonding 423 may not be necessary.

The PoP structure 400 may include an air gap 431 between the first package 410 and the second package 420. The air gap 431 may provide a thermal path for heat to flow from die 412 to the perimeter of structure 400. The air gap 431 may include spacers such as solder balls 441 that maintain the separation between first package 410 and second package 420. The thermal element or means 430 may include a portion positioned in the air gap 431 between the packages 410 and 420. The thermal element or means 430 may be composed on copper, aluminum, ceramic or similar material that stores or conducts heat. The thermal element or means 430 may be one element such as a heat spreader or a heat sink or a combination of the two. The thermal element or means 430 may include a first cutout area 432 and a second cutout area 433. The cutout areas 432 and 433 may correspond to the location of the solder balls 441 and be configured to encompass enough area to accommodate all the solder balls or spacers 441. A portion of element 430 may extend outside the perimeter of the second package 420. This may allow an upward thermal path to another heat sink or spreader (not shown).

Figure 5:
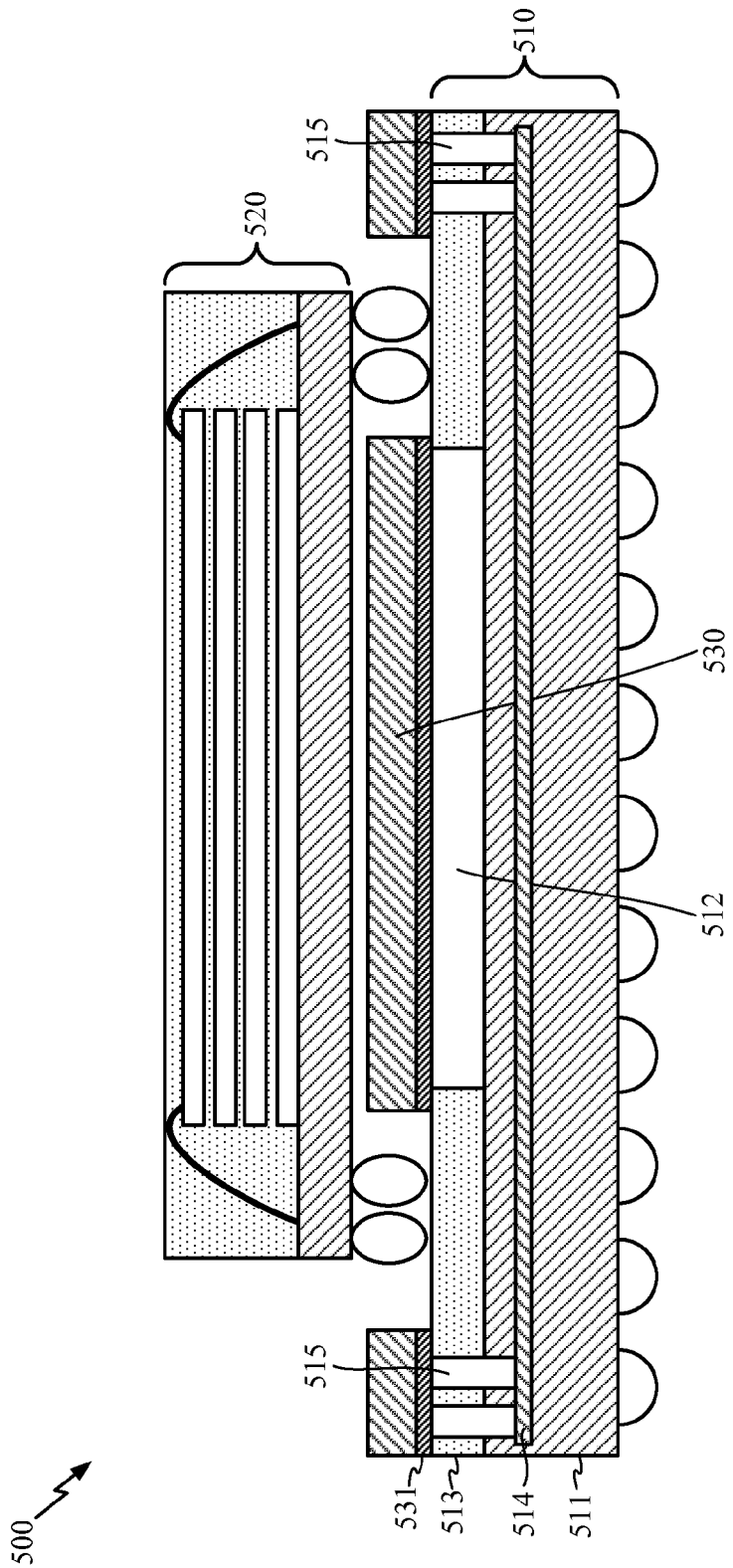
FIG. 5 depicts an exemplary side view of a semiconductor PoP structure with a thermal element.

FIG. 5 depicts an exemplary semiconductor PoP structure with a thermal element or means. As shown in FIG. 5, a semiconductor PoP structure 500 may include a first package 510, a second package 520 positioned above the first package 510, and a thermal element or means 530 positioned above the first package 510 between the first and second packages 510 and 520. The first package 510 may include a first package substrate 511 and a first package die 512 positioned on a first surface of the first package substrate 511 such that a front side of the die 512 faces the first surface of the substrate 511 and a backside of the die 512 faces the thermal element or means 530. The package 510 may include a molding material 513 encapsulating the die 512. The package 510 may be large in width than package 520 with package 520 being centered within the perimeter of package 510.

The package 510 may include a second thermal element or means 514 embedded within the substrate 511 and a plurality of thermal vias 515 extending between the first thermal element or means 530 and the second thermal element or means 514 at the peripheral edges of the first thermal element or means 530. The second thermal element or means 514 may be an existing structure such as a ground plane or an added structure that provides additional thermal benefits and paths for the package generated heat. The thermal vias 515 extend from a thermal interface layer 531 composed of thermal interface material through mold material 513 and partially through substrate 511 to the second thermal element or means 514. The thermal vias 515 are positioned at the edge or periphery of the package 510 under the wing or edge portion of the thermal element or means 530 between the edge and the cutouts in the thermal element or means 530. The thermal vias 515 help transfer heat from the first thermal element or means 530 to the second thermal element or means 514. The thermal vias 515 may be composed of thermally conductive material such as copper and may be any number and size such as 275 micron in width. The thermal vias are shown as rectangular vias but it should be understood that the thermal vias can be any shape or configured desired.

Figure 6:
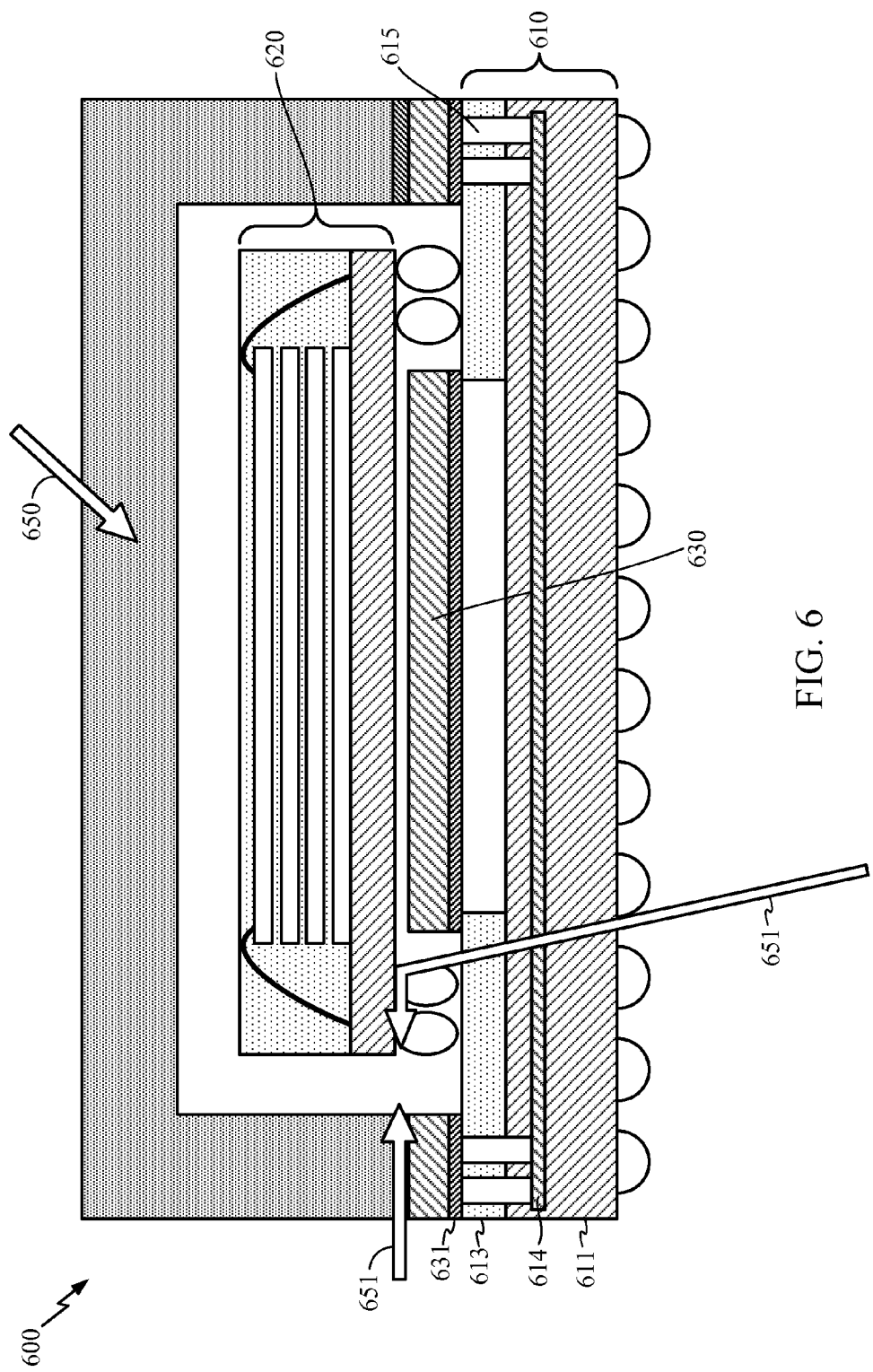
FIG. 6 depicts an exemplary side view of a semiconductor PoP structure with thermal elements.

FIG. 6 depicts an exemplary semiconductor PoP structure with thermal element or means. As shown in FIG. 6, a semiconductor PoP structure 600 may include a first package 610, a second package 620 positioned above the first package 610, and a thermal element or means 630 positioned above the first package 610 between the first and second packages 610 and 620. The first package 610 may include a first package substrate 611 and a first package die 612 positioned on a first surface of the first package substrate 611 such that a front side of the die 612 faces the first surface of the substrate 611 and a backside of the die 612 faces the thermal element or means 630. The package 610 may include a molding material 613 encapsulating the die 612. The package 610 may be large in width than package 620 with package 620 being centered within the perimeter of package 610.

The package 610 may include a second thermal element or means 614 embedded within the substrate 611 and a plurality of thermal vias 615 extending between the first thermal element or means 630 and the second thermal element or means 614 at the peripheral edges of the first thermal element or means 630. The thermal vias 615 extend from a thermal interface layer 631 composed of thermal interface material through mold material 613 and partially through substrate 611 to the second thermal element or means 614. The thermal vias 615 are positioned at the edge or periphery of the package 610 under the wing or edge portion of the thermal element or means 630 between the edge and the cutouts in the thermal element or means 630. The thermal vias 615 help transfer heat from the first thermal element or means 630 to the second thermal element or means 614. The thermal vias 615 may be composed of thermally conductive material such as copper and may be any number and size such as 275 micron in width. The thermal vias are shown as rectangular vias but it should be understood that the thermal vias can be any shape or configured desired.

The PoP structure 600 may include a third thermal element or means 650. The thermal element or means 650 may enclose the second package 620 forming a top hat like structure with an air gap 651 between an inner surface of element 650 and an outer surface of package 620. The air gap 651 can be sized as desired to achieve a specific overall form factor. For example, the air gap 651 may be approximately 750 microns wide. The third thermal element or means 650 may be thermally coupled with a device heat sink or spreader to add additional heat dissipation capacity.

Figure 7:
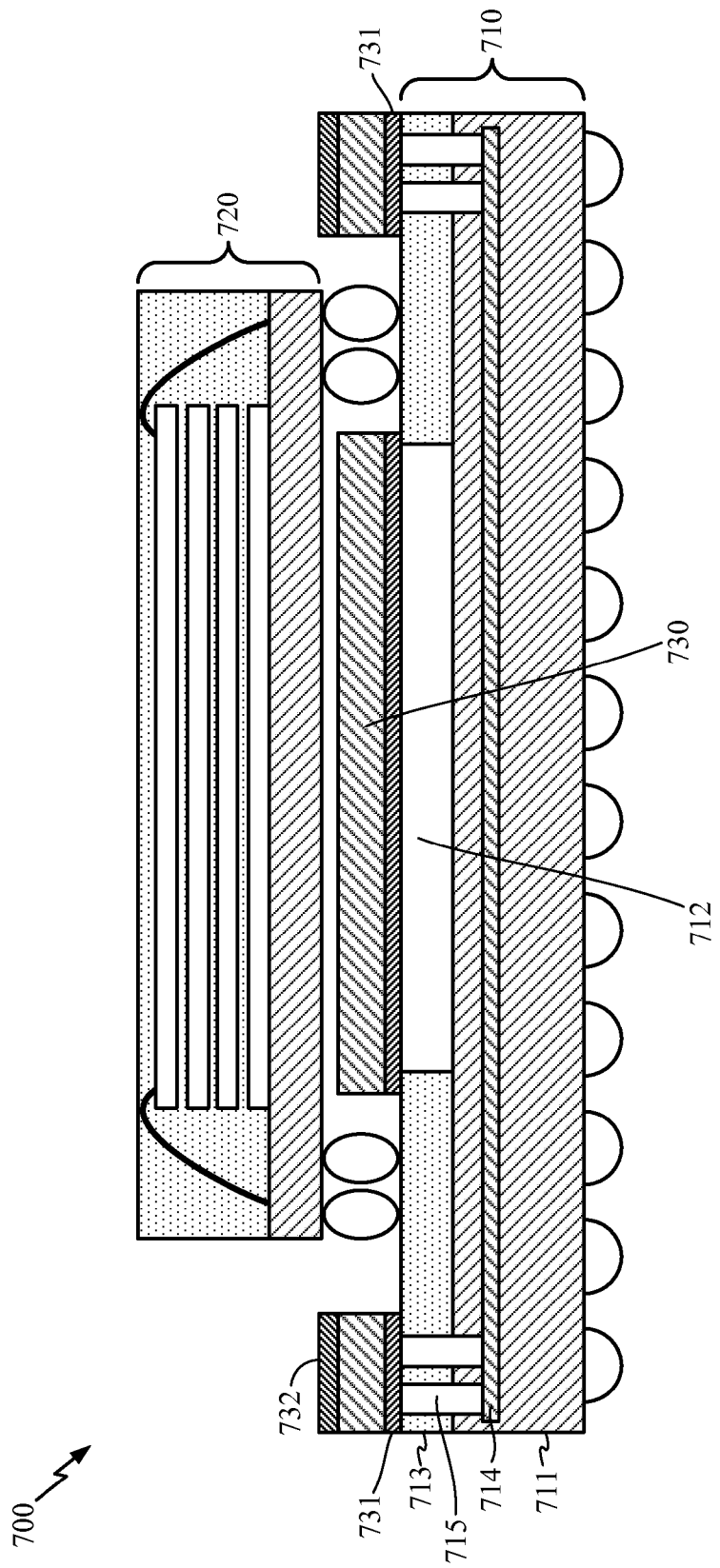
FIG. 7 depicts an exemplary side view of a semiconductor PoP structure with a thermal element.

FIG. 7 depicts an exemplary semiconductor PoP structure with a thermal element or means. As shown in FIG. 7, a semiconductor PoP structure 700 may include a first package 710, a second package 720 positioned above the first package 710, and a thermal element or means 730 positioned above the first package 710 between the first and second packages 710 and 720. The first package 710 may include a first package substrate 711 and a first package die 712 positioned on a first surface of the first package substrate 711 such that a front side of the die 712 faces the first surface of the substrate 711 and a backside of the die 712 faces the thermal element or means 730. The package 710 may include a molding material 713 encapsulating the die 712. The package 710 may be large in width than package 720 with package 720 being centered within the perimeter of package 710.

The package 710 may include a second thermal element or means 714 embedded within the substrate 711 and a plurality of thermal vias 715 extending between the first thermal element or means 730 and the second thermal element or means 714 at the peripheral edges of the first thermal element or means 730. The second thermal element or means 714 may be an existing structure such as a ground plane or an added structure that provides additional thermal benefits and paths for the package generated heat. The thermal vias 715 extend from a first thermal interface layer 731 composed of thermal interface material through mold material 713 and partially through substrate 711 to the second thermal element or means 714. A second thermal interface layer 732 may also be included on edge portions of the thermal element or means 730 outside the periphery of the second package 720. This second thermal interface material layer 732 may provide a landing pad for connections to additional thermal element or means such as a device heat sink or device frame acting as a heat sink and/or heat spreader. The thermal vias 715 are positioned at the edge or periphery of the package 710 under the wing or edge portion of the thermal element or means 730 between the edge and the cutouts in the thermal element or means 730. The thermal vias 715 help transfer heat from the first thermal element or means 730 to the second thermal element or means 714. The thermal vias 715 may be composed of thermally conductive material such as copper and may be any number and size such as 275 micron in width. The thermal vias are shown as rectangular vias but it should be understood that the thermal vias can be any shape or configured desired.

Figure 8:
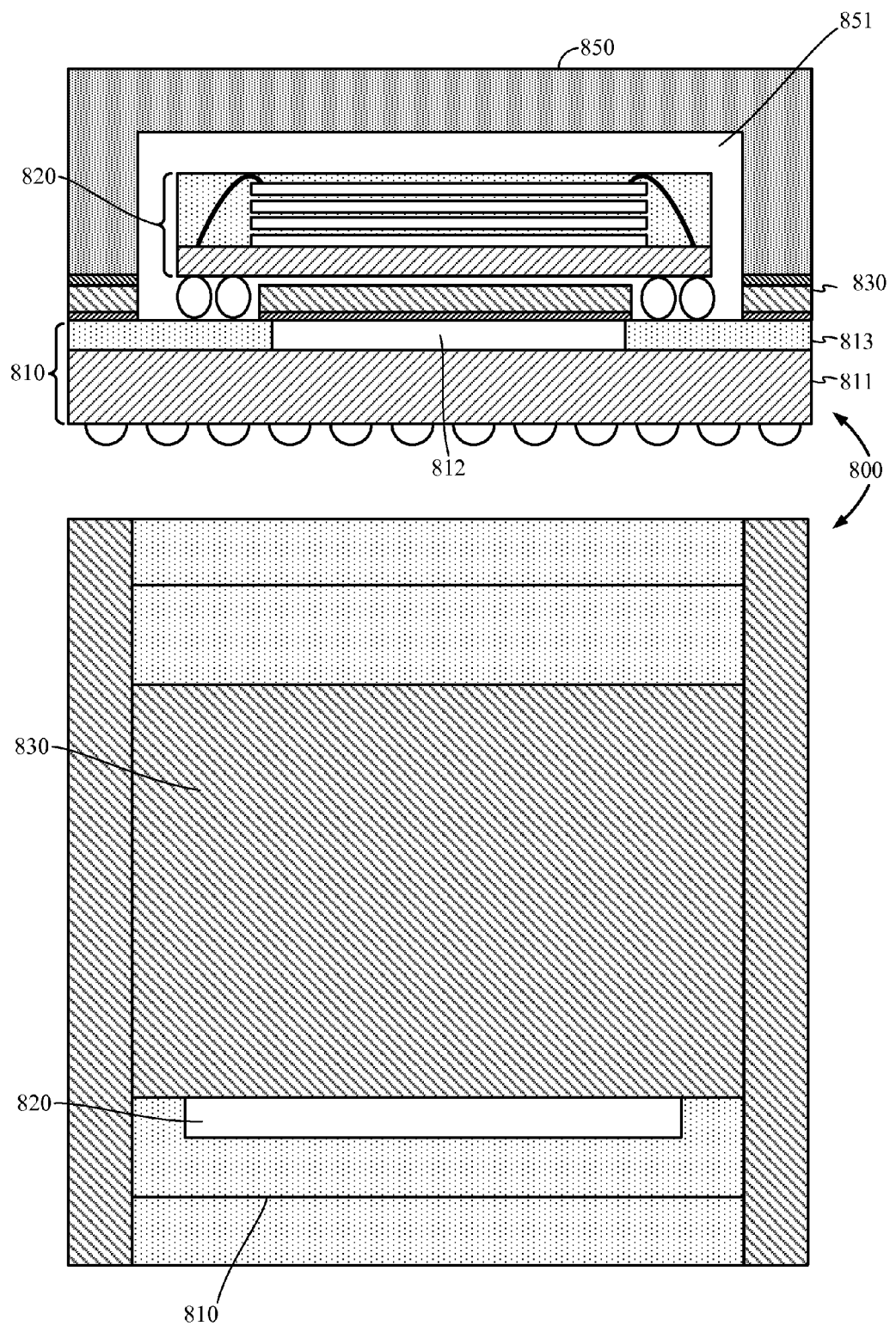
FIG. 8 depicts an exemplary top view and side view of a semiconductor PoP structure with thermal elements.

FIG. 8 depicts an exemplary semiconductor PoP structure with thermal element or means. As shown in FIG. 8, a semiconductor PoP structure 800 may include a first package 810, a second package 820 positioned above the first package 810, and a thermal element or means 830 positioned above the first package 810 between the first and second packages 810 and 820. The first package 810 may include a first package substrate 811 and a first package die 812 positioned on a first surface of the first package substrate 811 such that a front side of the die 812 faces the first surface of the substrate 811 and a backside of the die 812 faces the thermal element or means 830. The package 810 may include a molding material 813 encapsulating the die 812. The package 810 may be large in width than package 820 with package 820 being centered within the perimeter of package 810.

The PoP structure 800 may include another thermal element or means 850. The thermal element or means 850 may enclose the second package 820 forming a top hat like structure with an air gap 851 between an inner surface of element 850 and an outer surface of package 820. The air gap 851 can be sized as desired to achieve a specific overall form factor. For example, the air gap 851 may be approximately 750 microns wide. The thermal element or means 850 may be thermally coupled with a device heat sink or spreader to add additional heat dissipation capacity.

Figure 9:
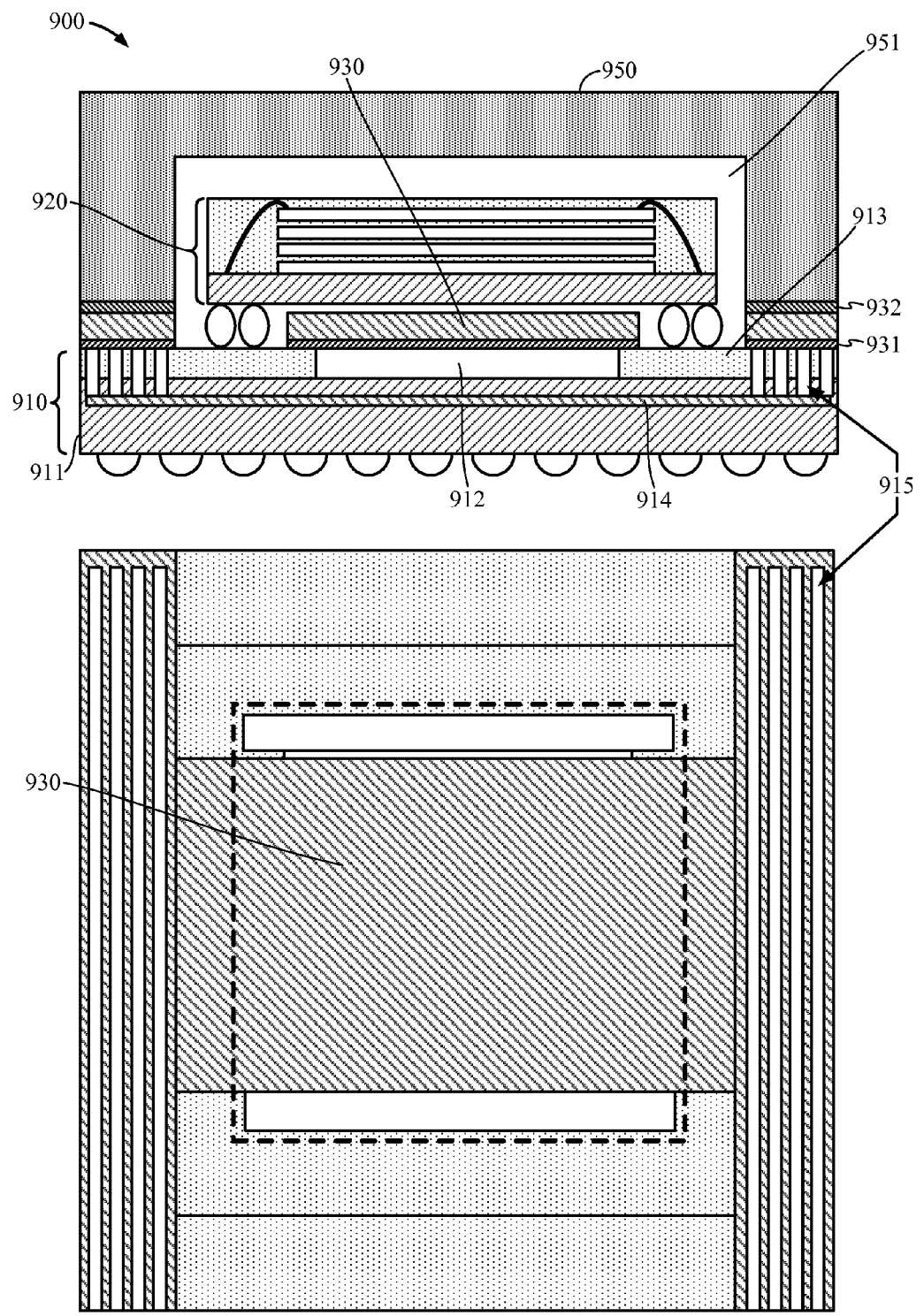
FIG. 9 depicts an exemplary top view and side view of a semiconductor PoP structure with thermal elements.

FIG. 9 depicts an exemplary semiconductor PoP structure with thermal element or means. As shown in FIG. 9, a semiconductor PoP structure 900 may include a first package 910, a second package 920 positioned above the first package 910, and a thermal element or means 930 positioned above the first package 910 between the first and second packages 910 and 920. The first package 910 may include a first package substrate 911 and a first package die 912 positioned on a first surface of the first package substrate 911 such that a front side of the die 912 faces the first surface of the substrate 911 and a backside of the die 912 faces the thermal element or means 930. The package 910 may include a molding material 913 encapsulating the die 912. The package 910 may be large in width than package 920 with package 920 being centered within the perimeter of package 910.

The package 910 may include a second thermal element or means 914 embedded within the substrate 911 and a plurality of thermal vias 915 extending between the first thermal element or means 930 and the second thermal element or means 914 at the peripheral edges of the first thermal element or means 930. The thermal vias 915 extend from a thermal interface layer 931 composed of thermal interface material through mold material 913 and partially through substrate 911 to the second thermal element or means 914. The thermal vias 915 are positioned at the edge or periphery of the package 910 under the wing or edge portion of the thermal element or means 930 between the edge and the cutouts in the thermal element or means 930. The thermal vias 915 help transfer heat from the first thermal element or means 930 to the second thermal element or means 914. The thermal vias 915 may be composed of thermally conductive material such as copper and may be any number and size such as 275 micron in width. The thermal vias are shown as two sets of four rectangular vias but it should be understood that the thermal vias can be any shape or configured desired.

The PoP structure 900 may include a third thermal element or means 950. The thermal element or means 950 may enclose the second package 920 forming a top hat like structure with an air gap 951 between an inner surface of element 950 and an outer surface of package 920. The air gap 951 can be sized as desired to achieve a specific overall form factor. For example, the air gap 951 may be approximately 750 microns wide. The third thermal element or means 950 may be thermally coupled with a device heat sink or spreader to add additional heat dissipation capacity. The third thermal element or means may be thermally coupled to the first thermal element or means 930 thorough a second thermal interface material layer 932. The first and second thermal interface material layers 931 and 932 may be composed of the same or different thermal materials.

Figure 10:
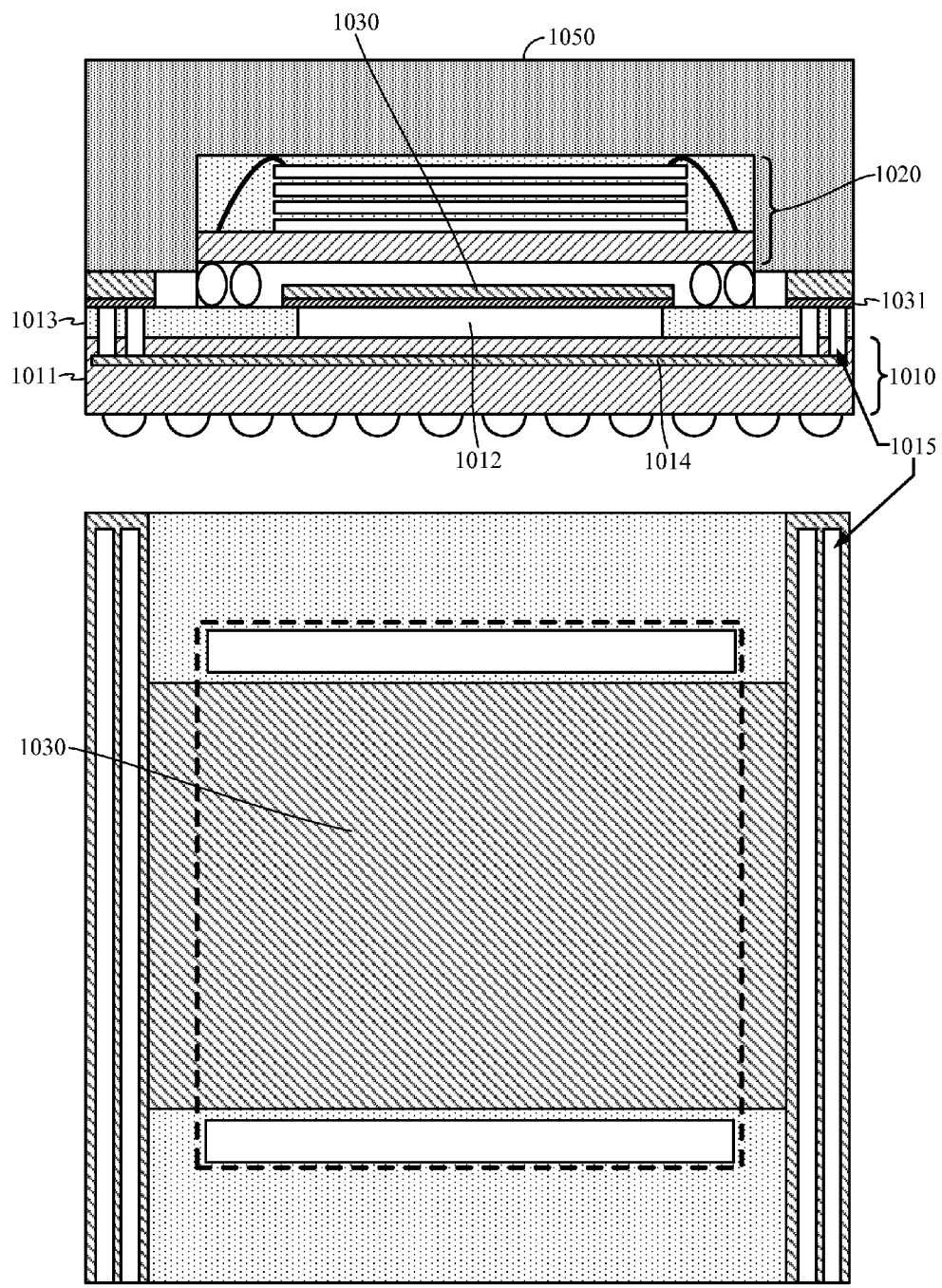
FIG. 10 depicts an exemplary top view and side view of a semiconductor PoP structure with thermal elements.

FIG. 10 depicts an exemplary semiconductor PoP structure with thermal element or means. As shown in FIG. 10, a semiconductor PoP structure 1000 may include a first package 1010, a second package 1020 positioned above the first package 1010, and a thermal element or means 1030 positioned above the first package 1010 between the first and second packages 1010 and 1020. The first package 1010 may include a first package substrate 1011 and a first package die 1012 positioned on a first surface of the first package substrate 1011 such that a front side of the die 1012 faces the first surface of the substrate 1011 and a backside of the die 1012 faces the thermal element or means 1030. The package 1010 may include a molding material 1013 encapsulating the die 1012. The package 1010 may be large in width than package 1020 with package 1020 being centered within the perimeter of package 1010.

The package 1010 may include a second thermal element or means 1014 embedded within the substrate 1011 and a plurality of thermal vias 1015 extending between the first thermal element or means 1030 and the second thermal element or means 1014 at the peripheral edges of the first thermal element or means 1030. The thermal vias 1015 extend from a thermal interface layer 1031 composed of thermal interface material through mold material 1013 and partially through substrate 1011 to the second thermal element or means 1014. The thermal vias 1015 are positioned at the edge or periphery of the package 1010 under the wing or edge portion of the thermal element or means 1030 between the edge and the cutouts in the thermal element or means 1030. The thermal vias 1015 help transfer heat from the first thermal element or means 1030 to the second thermal element or means 1014. The thermal vias 1015 may be composed of thermally conductive material such as copper and may be any number and size such as 275 microns in width. The thermal vias are shown as two sets of two rectangular vias but it should be understood that the thermal vias can be any shape or configured desired.

The PoP structure 1000 may include a third thermal element or means 1050. The thermal element or means 1050 may enclose the second package 1020 forming a top hat like structure. The third thermal element or means 1050 may be thermally coupled with a device heat sink or spreader to add additional heat dissipation capacity. The third thermal element or means may be thermally coupled to the first thermal element or means 1030.

Figure 11:
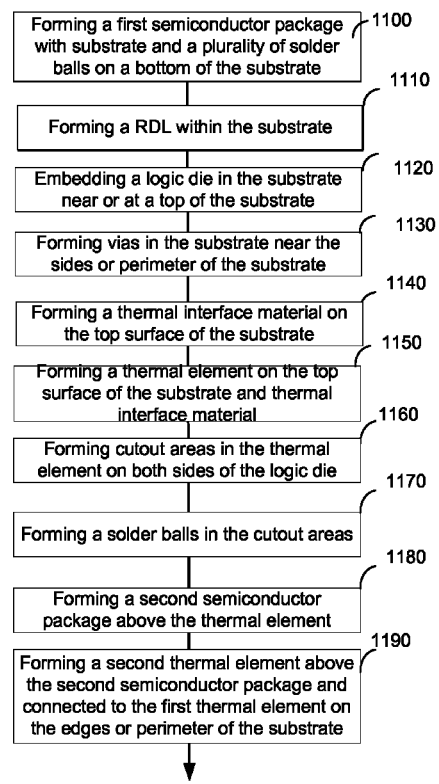
FIG. 11 depicts an exemplary method of forming a PoP structure according to some embodiments of the disclosure.

FIG. 11 depicts an exemplary method of forming a PoP structure according to some embodiments of the disclosure. In FIG. 11, the method begins at step 1100. In step 1100, a first semiconductor package is formed with a substrate and a plurality of solder balls on a bottom of the substrate. In step 1110, a redistribution layer (RDL) if formed within the substrate. In step 1120, a logic die is embedded in the substrate near or at the top surface of the substrate. In step 1130, vias are formed near the side edges of the substrate and to the sides of the logic die. The vias extend from the top surface of the substrate to the RDL. In step 1140, a thermal interface material is added to the top surface of the substrate above the logic die. In step 1150, a thermal element or means is formed and attached to the top surface of the substrate on the thermal interface material above the logic die. In step 1160, cut out areas are formed in the thermal element or means on both sides of the embedded logic die and within the perimeter of the substrate. In step 1170, solder balls are formed in the cut out areas and sized to provide an air gap above the thermal element or means. In step 1180, a second semiconductor package is formed above the thermal element or means and the solder balls in the cutout areas. The second semiconductor package is spaced from the thermal element or means by the solder balls in the cutout areas within the perimeter of the substrate. The second semiconductor package may include additional logic die, memory, or other semiconductor chips. In step 1190, a second thermal element or means is formed above the second semiconductor package and spaced therefrom to create an air gap around the second semiconductor package. The second thermal element or means is connected to the first thermal element or means on the edges or perimeter of the substrate of the first semiconductor package.

Some embodiments of the disclosure may include an additional routing layer on the back of a bottom package. For example, a substrate in a molded electronic package (MEP) or an additional backside RDL in a fan out wafer level package (FO-WLP). The additional routing layer may provide additional signal paths as well as heat transfer paths.

It should be understood that although the description above mentions copper and aluminum, substitute materials can be used in place of copper and aluminum. The substitute materials can include any type of material that stores or absorbs heat. The various embodiments of the disclosure provide an overall reduction in maximum die temperature as well as a reduction in the maximum temperature difference across the die. For example, use of various embodiments disclosed may result in a maximum temperature reduction of 3 to 13 degrees C. or a 4% to 11% from conventional PoP structures and a maximum temperature difference across the first package die of 3 to 9 degrees C. or 26% to 67% from conventional PoP structures.

Embodiments of the methods, apparatus, and systems described herein can be used in a number of applications. For example, the described embodiments could be used in MSM/APQ or other digital processor products with thermal challenges in smaller form factor devices and/or area constrained devices, TV and other media device options where PCDDR is used, and larger form factors when cheaper PCB are required as well as application that benefit by saving area and lowering system cost while maintaining thermal performance. Further applications should be readily apparent to those of ordinary skill in the art.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that-although a dependent claim can refer in the claims to a specific combination with one or a plurality of claims-other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative embodiments of the disclosure, it should be noted that various changes and modifications could be made herein without departing from the scope of the disclosure as defined by the appended claims. The functions, steps and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. A package on package semiconductor structure, comprising:
   a first package;
   a second package above the first package; and
   a first thermal element between the first package and the second package, wherein the first thermal element is separated from the second package by an air gap, wherein the first thermal element extends beyond an edge of the second package, and is coupled to a heat sink.

2. The structure of claim 1, wherein the first package includes a logic die and the first thermal element extends beyond an edge of the logic die.

3. The structure of claim 1, wherein the first package includes a processor and the second package includes a memory and wherein the first thermal element is thermally coupled to the processor.

4. The structure of claim 1, wherein the first thermal element has at least one cut out configured to allow for an interconnection between the first package and the second package.

5. The structure of claim 1, wherein the first thermal element comprises one or more metallic pieces.

6. The structure of claim 1, wherein the first thermal element comprises one or more ceramic pieces.

7. The structure of claim 1 wherein the first thermal element is formed from a plurality of pieces of thermally conductive material.

8. The structure of claim 1, further comprising a second thermal element positioned above the second package.

9. The structure of claim 8, wherein the second thermal element is connected to the first thermal element.

10. The structure of claim 9, further comprising a third thermal element positioned below the first thermal element.

11. The structure of claim 10, further comprising a thermal via coupling the first thermal element with the third thermal element.

12. The structure of claim 11, wherein the thermal via is a copper post extending from the first thermal element through a substrate to the third thermal element.

13. The structure of claim 12, wherein the third thermal element is embedded in the first package.

14. The structure of claim 13, wherein the second thermal element is spaced from the second package forming a second air gap.

15. The structure of claim 14, wherein a thickness of the first thermal element is approximately 100 to 200 μm.

16. The structure of claim 15, wherein the second air gap is approximately 750 μm.

17. A package on package semiconductor structure, comprising:
    a first package above a first surface of a substrate;
    a second package above the first package; and
    a first means for dissipating heat from the first package, wherein the first means is positioned between the first package and the second package and is separate from the second package by an air gap, wherein the first means extends beyond an edge of the second package, and is coupled to a heat sink.

18. The structure of claim 17, wherein the first package includes a logic die and the first means extends beyond an edge of the logic die.

19. The structure of claim 17, wherein the first package includes a processor and the second package includes a memory and wherein the first means is thermally coupled to the processor.

20. The structure of claim 17, wherein the first means has at least one cut out configured to allow for an interconnection between the first package and the second package.

* * * * *